United States Patent [19]

Ishimaru et al.

[11] Patent Number: 4,544,625

[45] Date of Patent: Oct. 1, 1985

[54] PHOTOSENSITIVE RESIN COMPOSITION AND PHOTOSENSITIVE ELEMENT

[75] Inventors: Toshiaki Ishimaru; Katsushige Tsukada; Nobuyuki Hayashi, all of Hitachi, Japan

[73] Assignee: Hitachi Chemical Company, Ltd., Tokyo, Japan

[21] Appl. No.: 576,717

[22] Filed: Feb. 3, 1984

Related U.S. Application Data

[63] Continuation-in-part of Ser. No. 308,023, Oct. 2, 1981, abandoned.

[30] Foreign Application Priority Data

Oct. 8, 1980 [JP]  Japan ................................ 55-141682

[51] Int. Cl.$^4$ ............................................. G03C 1/68
[52] U.S. Cl. ................................... 430/284; 430/281; 430/286; 430/270; 430/288; 430/271; 430/961; 204/159.15; 204/159.16; 204/159.17
[58] Field of Search ............... 430/284, 271, 286, 288, 430/281, 961; 204/159.15, 159.16, 159.17

[56] References Cited

U.S. PATENT DOCUMENTS

| | | | |
|---|---|---|---|
| 3,261,686 | 7/1966 | Celeste et al. | 430/288 |
| 3,824,104 | 7/1974 | Kloczewski et al. | 430/284 |
| 3,930,865 | 1/1976 | Faust et al. | 430/281 |
| 4,180,404 | 12/1979 | Ohmura et al. | 430/284 |
| 4,245,030 | 1/1981 | Faust et al. | 430/284 |
| 4,272,607 | 6/1981 | Tsukada et al. | 430/288 |
| 4,283,480 | 8/1981 | Davies et al. | 430/284 |

FOREIGN PATENT DOCUMENTS 57-62047  4/1982  Japan ................................ 430/286

*Primary Examiner*—Won H. Louie
*Attorney, Agent, or Firm*—Antonelli, Terry & Wands

[57] ABSTRACT

A photosensitive resin composition comprising (a) 20 to 75 parts by weight of an urethane diacrylate or dimethacrylate compound obtained by reacting trimethylhexamethylene diisocyanate with an acrylic or methacrylic monoester of a dihydric alcohol, (b) 20 to 75 parts by weight of a linear polymeric compound having a glass transition temperature of about 40° to 150° C., (c) a sensitizer and/or a sensitizer system which generate free radicals owing to actinic light, and (d) an acrylic or methacrylic ester containing a phosphoric acid group in the molecule in an amount of 0.01 to 5% by weight based on the total weight of components (a) and (b) is excellent in heat resistance, resistance to thermal shock and solvent resistance, and is suitable for forming a soldering mask. Further, a photosensitive element produced by forming a layer of the above-mentioned composition on a support gives a protective coating film excellent in heat resistance, resistance to thermal shock and solvent resistance, and is particularly suitable for a soldering mask.

18 Claims, 5 Drawing Figures

PHOTOSENSITIVE RESIN COMPOSITION AND PHOTOSENSITIVE ELEMENT

CROSS-REFERENCE TO RELATED APPLICATIONS

This application is a continuation-in-part of application Ser. No. 308,023 filed Oct. 2, 1981, abandoned.

BACKGROUND OF THE INVENTION

This invention relates to a photosensitive resin composition and a photosensitive element. More particularly it relates to a photosensitive resin composition for forming a protective coating film having excellent characteristics which can be used, for example, for producing a printed wiring board and for metal precise processing, and to a photosensitive element comprising a layer of said composition and a support film supporting said layer.

It is well known that photosensitive elements, i.e., device comprising a support film and a layer of substantially dried photosensitive resin composition formed thereon are used as a photoresist for producing a printed wiring board. Further, it is also widely known that photosensitive resin compositions having excellent characteristics which can be used in a soldering mask, a resist for chemical plating, and the like are very useful.

Main objects of a soldering mask are to limit a soldering region at the time of soldering to prevent soldering bridge and the like; to prevent corrosion of a naked copper conductor, and to keep electric insulation between conductors. For these objects, thermosetting ink such as epoxy resin or the like, or photosetting ink has heretofore been screen-printed. However, in recent years, a wiring density of a printing board has been increased, and a soldering mask used for it has become difficult, with respect to precision, to form by a screen-printing method. With improvement in wiring density, electric insulation between conductors has come to be more severely required, and the thickness of a conductor-protecting film has come to be required to be at least about 20 μm or more. When a screen-printing method is used, the average thickness of a resist which can be formed at a time is at most 30 μm, and the thickness of the thinnest part of a resist formed on the projecting part of a conductor inevitably becomes 10 μm or less. When printing is repeated two or three times, a thick film can be obtained, however, it is substantially very difficult with respect to printing precision and because of process complications. Therefore, the advent of a photosensitive element for forming a soldering mask is desired. Photosensitive elements in which the thickness of a layer of a photosensitive resin composition is 20 μm or more are useful. Since the thickness of a conductor in most printed wiring is 18 μm or more, photosensitive elements in which the thickness of a layer of a photosensitive resin 40 μm or more are particularly useful.

In general, photosensitive elements for etching or electrolytic plating which are called photosensitive dry films and used for forming a conductor pattern of a printed wiring board do not have sufficient heat resistance, and hence cannot be used for forming a soldering mask.

Accordingly, there have been presented many proposals of a photosensitive resin composition for a photosensitive element good in heat resistance which can be used for forming a soldering mask (for example, Japanese patent application Kokai (Laid-Open) No. 56018/78 (U.S. patent application Ser. No. 735,979 filed Oct. 27, 1976), Japanese patent application Kokoku (Post-Exam Publn) No. 43,092/77 and Japanese patent application Kokoku (Post-Exam. Publn) No. 44,346/78 (U.S. patent application Ser. No. 782,378 filed Mar. 29, 1977)). The photosensitive resin compositions in these proposals are excellent in heat resistance which is one of the objects of the proposals, however when a thick protective film of 40 μm or more in thickness is formed from the compositions, the film cracks within 5 cycles in a thermal shock test holding at 125° C. then holding at −65° C. repeatingly (MIL-STD-202E, method 107D, condition B). The thicker the film becomes, the more seriously the film cracks. This becomes a serious problem when the reliability of a printed wiring board for a long time should be taken into consideration.

Among soldering masks formed by a screen-printing method, there are those which are good in resistance to thermal shock. This is mainly because the thickness of soldering masks formed by a screen-printing method is 10 to 30 μm. Another reason is that printing ink generally contains a large amount of a filler. It is well known that the presence of the filler contributes to improvement in the resistance to thermal shock. However, in the case of a photosensitive element, its layer of a photosensitive resin composition should substantially be dried before irradiation with actinic light, and should be film forming. This means that the layer of a photosensitive resin composition is required to contain a linear high-molecular compound to enhance its film forming ability. Therefore, it is difficult for the layer to contain a large amount of a filler in addition to a linear high-molecular compound, an actinic-lightsensitive compound and a sensitizer.

Further, the present inventors have done various researches to find that when a layer of a photosensitive resin composition for producing a photosensitive element is provided with about 10% by weight of a filler, the element gives a soldering mask improved in resistance to thermal shock but is deteriorated in soldering-heat-resistance which is one of the main characteristics of the mask, and hence is not practical.

As compounds used in photosetting ink for screen pringing, various urethane acrylate compounds or urethane methacrylate compounds (hereinafter referred to as "urethane (meth)acrylate compounds") have been proposed as those which are excellent in heat resistance. However, great difficulty is raised when these compounds are used not in photosetting ink but in the photosensitive element usually accompanied by imagewise exposure and development which is an object of this invention. A first difficulty is that many of the proposed urethane (meth)acrylate compounds are not miscible or are very poorly miscible with linear high-molecular compounds, particularly vinyl series copolymeric linear high-molecular compounds. A second difficulty is that many of the proposed urethane (meth)acrylate compounds are insoluble in noncombustible solvents used for the development of a photosensitive element, particularly in 1,1,1-trichloroethane series solvent which is generally most often used. Urethane (meth)acrylate compounds overcoming the above-mentioned difficulties and usable for providing photosensitive elements with excellent thermal shock and heat resistance have not yet been known.

One of conventional methods for improving the thermal shock is to use a compound sensitive to actinic light and having a larger molecular weight per photosensitive group. The molecular weight per photosensitive group is preferably 300 or more, more preferably 500 or more. But a cured film obtained from a photosensitive composition using a compound sensitive to actinic light and having a large molecular weight per photosensitive group is good in the thermal shock but is inferior in solvent resistance, heat resistance and the like properties. Therefore, the molecular weight per photosensitive group should properly be determined from the balance between the thermal shock and other properties such as solvent resistance, and the like.

On the other hand, U.S. Pat. No. 4,272,607 to Tsukada et al discloses a photosensitive resin composition useful as a solder resist including a linear polymer or copolymer having tetrahydrofurfuryl groups at side chains but is quite silent on the use of urethane diacrylate or dimethacrylate obtained from trimethylhexamethylene diisocyanate. U.S. Pat. No. 3,930,865 to Faust et al and U.S. Pat. No. 4,245,030 to Faust et al disclose photopolymerizable compositions which are still insufficient in heat resistance and adhesiveness of a coating film to a substrate after solder treatment, since these compositions are aimed at for producing printing plates, photoresists, etc, which do not require so high resistance to heat, or thermal shock as in the case of solder mask.

Therefore, it will be useful to discover special photosensitive compounds excellent in solvent resistance although the molecular weight per photosensitive group is large, or in contrast, to discover special photosensitive compounds having small molecular weight per photosensitive group and being excellent not only in solvent resistance, heat resistance, etc., but also in the thermal shock.

SUMMARY OF THE INVENTION

The present inventors have studied extensively and found that urethane di(meth)acrylate compounds (this means urethane diacrylate compounds or urethane dimethacrylate compounds and is used hereinafter in the same meaning) obtained by reacting (i) trimethylhexamethylene diisocyanate with (ii) a (meth)acrylic monoester (this means an acrylic monoester or a methacrylic monoester and is used hereinafter in the same meaning) of a dihydric alcohol are special photosensitive compounds which can finally give a cured film good in the thermal shock, although they have relatively smaller molecular weight per photosensitive group.

This invention is to provide a photosensitive resin composition excellent in heat resistance and in resistance to thermal shock which can be used for forming a soldering mask, and a photosensitive element comprising a layer of said composition and a support film supporting said layer.

This invention provides a photosensitive resin composition comprising
(a) 20 to 75 parts by weight of an urethane diacrylate or urethane dimethacrylate compound that has a molecular weight of 600 or less and that is obtained by reacting
 (i) trimethylhexamethylene diisocynate and
 (ii) an acrylic or methacrylic monoester of a dihydric alcohol which has 1 to 8 carbon atoms,
(b) 20 to 75 parts by weight of a linear polymeric compound having a glass transition temperature of about 40° to 150° C., (c) a sensitizer and/or a sensitizer system which generate free radicals owing to actinic light in an amount of 0.5 to 10% by weight based on the total weight of the urethane diacrylate or urethane dimethacrylate compound (a) and the linear polymeric compound (b), and
(d) an acrylic or methacrylic ester containing a phosphoric acid group in the molecule represented by the formula:

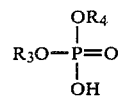

wherein $R_3$ is an organic group including an acryloyl or methacryl group; and $R_4$ is hydrogen or an organic group including an alkyl group, an acryloyl or methacryloyl group, in an amount of 0.01 to 5% by weight based on the total weight of the urethane diacrylate or urethane dimethacrylate compound (a) and the linear polymeric compound (b).

Further, this invention provides a photosensitive element for forming a solder mask comprising (I) a layer of a photosensitive resin composition comprising (a) 20 to 75 parts by weight of a urethane diacrylate or urethane dimethacrylate compound that has a molecular weight of 600 of or less and that is obtained by reacting (i) trimethylhexamethylene diisocyanate, and (ii) an acrylic or methacrylic monoester of a dihydric alcohol which has 1 to 8 carbon atoms, (b) 20 to 75 parts by weight of a linear polymeric compound having a glass transition temperature of about 40° to 150° C., (c) a sensitizer and/or a sensitizer system which generate free radicals owing to actinic light in an amount of 0.5 to 10% by weight based on the total weight of the urethane diacrylate or urethane dimethacrylate compound (a) and the linear polymeric compound (b), and (d) an acrylic or methacrylic ester containing a phosphoric acid group represented by the formula:

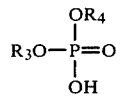

wherein $R_3$ is an organic group including an acryloyl or methacryloyl group; and $R_4$ is hydrogen or an organic group including an alkyl group or an acryloyl or methacryloyl group, in the molecule in an amount of 0.01 to 5% by weight based on the total weight of the urethane diacrylate or urethane dimethacrylate compound (a) and the linear polymeric compound (b), and (II) a support film supporting said layer.

BRIEF DESCRIPTION OF THE DRAWINGS

In the attached drawings.

DESCRIPTION OF THE PREFERRED EMBODIMENTS

Figure 1:
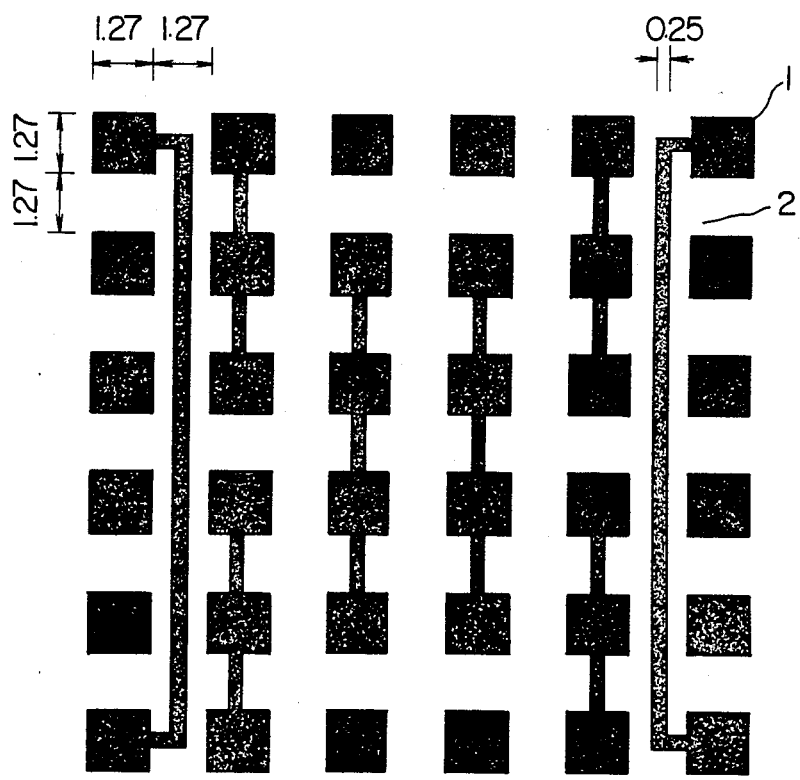
FIG. 1 shows a copper pattern of test substrates used in Examples.

The photosensitive resin composition of this invention is explained below in detail.

The photosensitive resin composition of this invention contains as an indispensable component a urethane di(meth)acrylate compound (a) obtained by reacting (i) trimethylhexamethylene diisocyanate, and (ii) a (meth-)acrylic monoester of a dihydric alcohol.

As the trimethylhexamethylene diisocyanate (TMDI), which is a mixture of 2,2,4-trimethylhexamathylene diisocyanate and 2,4,4-trimethylhexamethylene diisocyanate, that manufactured by, for example, Veba Chemie Co., Ltd. (West Germany) can be used.

As the dihydric alcohol component of (ii), there can be used methylene glycol, ethylene glycol, diethylene glycol, triethylene glycol, tetraethylene glycol, propylene glycol, dipropylene glycol, 1,4-butanediol, 1,3-butanediol, 2,3-butanediol, 1,5-penetanediol, 1,6-hexanediol, neopently glycol, and the like.

As the (meth)acrylic monoester of a dihydric alcohol, there can be used 2-hydroxyethyl (meth)acrylate, 2-hydroxypropyl (meth)acrylate, 1,4-butanediol mono(-meth)acrylate, 1,3-butanediol mono(meth)acrylate, and the like.

The obtained urethane di(meth)acrylate can be represented by the following formula:

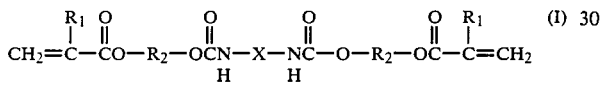

$$CH_2=\overset{R_1}{\underset{|}{C}}-\overset{O}{\underset{\|}{C}}O-R_2-O\overset{O}{\underset{\|}{C}}N-X-N\overset{O}{\underset{\|}{C}}-O-R_2-O\overset{O}{\underset{\|}{C}}-\overset{R_1}{\underset{|}{C}}=CH_2 \quad (I)$$
$$\phantom{CH_2=C-CO-R_2-OC}H\phantom{-X-N}H$$

In the formula (I), $R_1$ is H or $CH_3$; $R_2$ is a residue of a dihydric alcohol; and X is a trimethylhexamethylene group.

The molecular weight of the urethane di(meth)acrylate compound (a) is, for example, 442 when 1 mole of trimethylhexamethylene diisocyanate is reacted with 2 moles of 2-hydroxyethyl acrylate, the molecular weight per photosensitive group being 221. When 1 mole of trimethylhexamethylene diisocyanate is reacted with 2 moles of 2-hydroxypropyl methacrylate, the molecular weight of the resulting urethane dimethacrylate compound is 498 and the molecular weight per photosensitive group is 249.

In order to make solvent resistance and heat resistance of the formed solder mask better, it is preferable to use the urethane di(meth)acrylate compound having a molecular weight of 600 or less.

When the urethane di(meth)acrylate compound of this invention is synthesized, the reaction is usually effected at a temperature of from 40° to 100° C., and it is preferable to determine the amounts of trimethylhexamethylene diisocyanate (i), and the (meth)acrylic monoester of a dihydric alcohol (ii), so as to effect the reaction so that the isocyanate equivalent of trimethylhexamethylene diisocyanate (i) may be almost equal to the alcohol equivalent of and the (meth)acrylic monoester of a dihydric alcohol (ii). However, the isocyanate equivalent may be a little over or a little below the alcohol equivalent. When the isocyanate equivalent is a little over the alcohol equivalent, the excess isocyanate groups are finally reacted with a monohydric alcohol such as methanol, whereby the free isocyanate groups can be eliminated.

The urethane di(meth)acrylate compound content ranges from 20 to 75 parts by weight from a consideration of the heat resistance and the resistance to thermal shock.

The photosensitive resin composition of this invention contains as an indispensable component a linear high-molecular compound (b) having a glass transition temperature of about 40° to 150° C.

When the glass transtition temperature is lower than about 40° C., the heat-resistance of the formed soldering mask is low. When the glass transition temperature exceeds about 150° C., the miscibility of said compound (b) with the urethane di(meth)acrylate compound is lowered, so that it becomes impossible to form a layer of the photosensitive resin composition on a support film or a substrate. As the linear high polymer of the (b) component, there may be used a thermoplastic polymer disclosed in Japanese patent application Kokoku (Post-Exam Publn) No. 15,932/66 (U.S. patent application Ser. No. 274,909 filed April 23, 1963). There may be used, for example, vinyl series linear polymers or copolymers, copolyester, polyamides, vinylidene chloride copolymers, syhthetic rubbers, and the like. Vinyl series linear copolymers are preferred from the viewpoint of miscibility with the urethane di(meth)acrylate compound and adhesion between the printed wiring substrate and the layer of a photosensitive resin composition, though vinyl series homopolymers may be used. As the copolymerization component of the linear high-molecular compounds, various vinyl monomers may be used. Suitable examples of the vinyl monomers include methyl methacrylate, butyl methacrylate, ethyl acrylate, styrene, α-methylstyrene, vinyltoluene, 2-hydroxyethyl methacrylate, 2-hydroxypropyl methacrylate, 2-hydroxyethyl acrylate, acrylic acid, methacrylic acid, glycidyl methacrylate, t-butylaminoethyl methacrylate, 2,3-dibromopropyl methacrylate, 3-chloro-2-hydroxypropyl methacrylate, acrylamide, acrylonitrile, and the like.

If the formed soldering mask is required to be flame-retardent, monomers containing one or more bromine atoms may be used as the copolymerization component. The content of the bromine atoms in the linear high-molecular compound is suitably up to 40% by weight, and when it exceeds 40% by weight, there is a tendency that the resistance to thermal shock is lowered. As the monomers containing one or more bromine atoms, tribromophenyl (meth)acrylate (this means tribromophenyl acrylate or tribromophenyl methacrylate; and also used hereinafter) is preferred. When the copolymerized amount of tribromophenyl (meth)acrylate is less than 5% by weight, there is little difference in its effect on the flame retardancy between a compound in which it is copolymerized and a compound in which it is not copolymerized. When the copolymerized amount exceeds 65% by weight, the resistance to thermal shock is lowered. The use of antimony trioxide in the photosensitive resin composition is effective for the flame-retardancy. However, when the antimony trioxide content in the photosensitive resin composition exceeds 5% by weight, there is brought about disadvantageous effects on the heat resistance and the like of the formed soldering mask.

The content of the linear high-molecular compound in the photosensitive resin composition ranges from 20 to 75 parts by weight from the viewpoint of the heat resistance and the resistance to thermal shock.

The photosensitive resin composition of this invention contains as an indispensable component a sensitizer and/or a sensitizer system (c) which generates free radicals owing to actinic light. Examples of the sensitizer include substituted and unsubstituted polynuclear quinones such as 2-ethylanthraquinone, 2-t-butylanthraquinone, octamethylanthraquinone, 1,2-benzanthraquinone, 2,3-diphenylanthraquinone, and the like; ketoaldonyl compounds such as diacetyl, benzyl, and the like; α-ketoaldonyl alcohols and ethers such as benzoin, pivalone, and the like; α-hydrocarbon-substituted aromatic acryloins such as α-phenylbenzoin, α,α-diethoxyacetophenone, and the like; and aromatic ketones such as benzophenone, 4,4'-bisdialkylaminobenzophenone, and the like. These may be used alone or in combination of two or more of them. The term "sensitizer system" used herein refers to a combination of a sensitizer and a sensitizing assistant, and as examples of the combination, there are combination of 2,4,5-triarylimidazole dimer and 2-mercaptobenzoquinazole, leucocrystal violet, tris(4-diethylamino-2-methylphenyl)methane, or the like. There may be used additives which have no photoinitiating property by itself but can constitute a good sensitizer system excellent in photoinitiating property as a whole when used in combination with the above-mentioned materials. The additives are, for example, tertiary amines such as triethanolamine and the like which are used in combination with benzophenone. These sensitizers and/or sensitizer systems are contained preferably in an amount of 0.5 to 10% by weight based on the sum of amounts of the above-mentioned (a) urethane di(meth)acrylate compound and (b) linear polymeric compound.

The composition of this invention contains as the component (d) an acrylic or methacrylic ester containing a phosphoric acid group in the molecule represented by the formula:

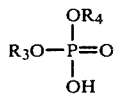

wherein $R_3$ is an organic group including an acryloyl or methacryloyl group; and $R_4$ is hydrogen or an organic group including an alkyl group or an acryloyl or methacryloyl group, in order to improve adhesion between the formed soldering mask and the printed wiring substrate.

Examples of the (meth)acrylic esters containing a phosphoric acid group include PM-1, PM-2, PA-1 and PA-2 in KAYAMER ® series manufactured by Nihon Kayaku Co., Ltd., Phosmer M ® (acid phosphoxyethyl methacrylate), Phosmer CL ® (3-chloro-2-acid phosphoxypropyl methacrylate) manufactured by Fats and Oils Articles Co., Ltd., etc. The content of these (meth)acrylic esters containing in the molecule a phosphoric acid group is preferably 0.01 to 5% by weight based on the total amounts of the above-mentioned (a) urethane di(meth)acrylate compound and (b) linear polymeric compound.

The photosensitive resin composition of this invention may contain other photopolymerizable unsaturated compounds. As the other photopolymerizable unsaturated compounds, there may be exemplified trimethylolpropane triacrylate, pentaerythritol triacrylate, tetraethyleneglycol diacrylate, and the like. It is also possible to use urethane (meth)acrylate compounds obtained by substituting a part of the (meth)acrylic ester of dihydric alcohol portion of the urethane (meth)acrylate compound of this invention by a saturated dihydric alcohol.

There may also be used polymerizable unsaturated compounds disclosed in Japanese patent application Kokai (Laid-Open) No. 56,018/78 (U.S. patent application Ser. No. 735,979 filed Oct. 27, 1976). However, the content of these other photopolymerizable unsaturated compounds is preferably 20% by weight or less, particularly preferably 10% by weight or less based on the total amounts of the above-mentioned (a) urethane di(meth)acrylate compound and (b) linear polymeric compound from a consideration of balance between the heat resistance and the resistance to thermal shock.

Further, the photosensitive resin composition of this invention may contain other secondary components. The secondary components include thermopolymerization inhibitors, dyes, pigments, coating property improvers, and the like, and these are selected with the same consideration as in the case of ordinary photosensitive resin compositions.

Next, the photosensitive element of this invention is explained below in detail.

Figure 4:
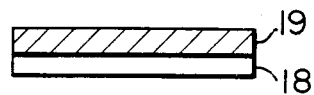
FIGS. 4 and 5 are cross-sectional views showing examples of the photosensitive elements of this invention.

The photosensitive element of this invention can be obtained by forming a layer 19 of the photosensitive resin composition explained above in detail on a support film 18 as shown in FIG. 4. The layer of the photosensitive resin composition can be formed on a support film by a conventional process. For example, it can be formed by uniformly dissolving the photosensitive resin composition in an organic solvent such as methyl ethyl ketone, toluene, methylene chloride, or the like (or dispersing it thereinto when a flame-retarding assistant such as antimony trioxide, a pigment, or the like is used), applying the resulting solution onto said support film by a knife coating method, a roll coating method, or the like, and then drying the solution. The amount of the remaining solvent in the photosensitive layer is limited to preferably 2% by weight or less, particularly preferably 1% by weight or less.

It is preferable that the support film used in this invention has heat resistance and solvent resistance which are necessary at the time of the production of the photosensitive element. The support film may be either pervious or not pervious to actinic light. Preferable examples of the support film include well-known films such as a polyester film, a polypropylene film, a polyimide film, a polyamide-imide film, a polystyrene film and the like.

Figure 5:
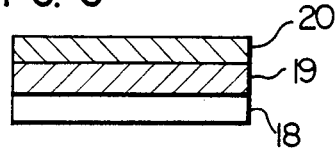

When a long photosensitive element is produced, said element is wound into a roll in the final step of the production. In this case, the layer of the photosensitive resin composition can be prevented from adhering to the back side of the support film in winding the element into a roll, by using a support film whose back side has been treated by a method well known in the field of a pressure-sensitive sticking tape and the like. It is preferable to laminate a covering film 20 as shown in FIG. 5 which can be peeled off on the layer of a photosensitive resin composition of said element, for the same object as above, an object of preventing the adhesion of dust, etc.

As examples of the covering film which can be peeled off, there are a polyethylene film, a polypropylene film, a Teflon film, surface-treated paper, and the like, and any covering film may be used so long as adhesion between it and the layer of a photosensitive resin composition is lower than adhesion between the layer of a photosensitive resin composition and the support film when it is peeled off.

The thickness of the layer of a photosensitive resin composition constituting the photosensitive element of this invention is preferably 20 to 200 μm for keeping high electric insulation between the conductors of a printed wiring substrate in which the layer is used, and from the viewpoint of the resolution of the formed soldering mask pattern.

Next, examples of a method for using the photosensitive element of this invention are explained below.

The photosensitive element of this invention is easy to laminate on a substrate. That is to say, it is laminated, with heating under pressure, as such when it has no covering film, or after or while peeling off its covering film when it has a covering film. The lamination with heating under pressure can be carried out by means of a laminater which is well known to printed-wiring board manufacturers. When the substrate has unevenness of 10 μm or more as in the case of printed wiring board in which conductor-wiring lines have been formed, it is preferable to carry out the lamination under reduced pressure or in vacuo.

As an apparatus for such lamination, there is, for example, a laminating apparatus disclosed in Japanese patent application Kokoku (Post-Exam Publn) No. 31,670/78 (U.S. Pat. No. 4,101,364) or Japanese patent application Kokoku (Post-Exam Publn) No. 13,341/80 (U.S. Pat. No. 4,127,436).

The exposure and the development treatment after the lamination can be carried out by a conventional method. That is to say, when the support film is not pervious to actinic light, the support film is peeled off and thereafter the imagewise exposure is carried out through a negative mask by using a light source such as a high pressure mercury arc lamp, an ultra-high pressure mercury lamp, or the like. Heat treatment at 50° to 100° C. before and after the exposure is preferable for increasing adhesion between the substrate and the photosensitive resin layer.

As the developing solution, a solvent such as 1,1,1-trichloethane or the like is used. It is preferable for safety to use a noncombustible solvent.

The imagewise protective coating film obtained in the manner described above is an anticorrosive coating film for usual etching, metal plating, and the like, and it becomes a protective coating film having more excellent characteristics by heat treatment at 80° to 200° C. and exposure to actinic light after the development. As to the order of the heat treatment and the exposure to actinic light after the development, either may be the first, and each of them may be carried out by dividing into several steps. The protective coating film obtained by heat treatment and exposure to actinic light after the development is sufficiently resistant to organic solvents such as trichlene (trichloroethylene), methyl ethyl ketone, isopropyl alcohol, toluene, and the like and is resistant also to an acidic aqueous solution and an aqueous alkali solution. Furthermore, it is excellent in heat resistance and resistance to thermal shock, and hence is suitable as a parmanent protective coating film such as a soldering mask and the like which is required to have reliability for a long time.

The protective coating film having as excellent characteristics as in the above can also be obtained by directly coating a substrate with a solution of the photosensitive resin composition of this invention by a dip coating method, a flow coating method, or the like, drying the solvent, imagewisely exposing the coating through a negative mask in the same manner as in the case of the above-mentioned photosensitive element, directly or after laminating a film pervious to actinic light on the coating, carrying out development, and then carrying out heat treatment and exposure to actinic light.

Since a coating film formed by using the photosensitive resin composition or the photosensitive element of this invention has excellent chemical and physical characteristics as mentioned above, it is used also in printing materials, plastics reliefs, and the like.

Next, this invention is further explained below referring to Examples, in which all parts and percents are by weight unless otherwise provided.

EXAMPLE 1

(a) Synthesis of a urethane diacrylate compound

| | | | |
|---|---|---|---|
| A | Trimethylhexamethylene diisocyanate | 1,680 | parts (16 equivalents) |
| | Toluene (solvent) | 1,200 | parts |
| | Di-n-butyl tin dilaurate (catalyst) | 1 | part |
| B | 2-Hydroxypropyl acrylate | 2,080 | parts (16 equivalents) |
| | Toluene (solvent) | 379 | parts |
| | Hydroquinone (thermopolymerization inhibitor) | 0.4 | part |
| C | Methanol (stopping agent) | 32 | parts |

The ingredient A was placed in a reactor having a capacity of about 5 liters equipped with a thermometer, a stirrer, a condenser, a nitrogen-gas-introducing tube and a dropping funnel, which reactor could be heated and cooled, and then heated to 60° C. with stirring. The ingredient B was uniformly added dropwise to the ingredient A in the reactor over a period of about 5 hours while maintaining the reaction temperature at 55° to 65° C. After the addition of the ingredient B, the reaction temperature was raised to 80° C. gradually in about 5 hours, and then lowered to 60° C. Subsequently, the ingredient C was added thereto and stirring was continued for about 1 hour. Thus there was obtained a solution (I) of a urethane diacrylate compound which contained 70% of nonvolatile matters.

(b) Production of a photosensitive element

| | |
|---|---|
| The solution (I) of the urethane diacrylate compound obtained in the manner described above | 70 parts (49 parts in terms of nonvolatile matters) |
| Methyl methacrylate-methacrylic acid-tetrahydrofurfuryl methacrylate (78/2/20; weight ratio) copolymer (having a molecular weight of about 150,000 and a glass transition temperature of about 95° C.) | 47 parts |
| Benzophenone | 4 parts |
| Michler's ketone | 0.2 part |
| PHOSMER M(a methacrylate containing phosphoric acid groups, manufactured by Yushi Seihin K.K.) | 0.2 part |
| p-Methoxyphenol | 0.1 part |
| Crystal violet | 0.1 part |
| Methyl ethyl ketone | 80 parts |

A solution of a photosensitive resin composition was prepared by mixing the above-mentioned ingredients and then applied to a polyimide film of about 50 μm in thickness, and then dried at room temperature for 20 minutes, at 80° C. for 10 minutes and then at 105° C. for 5 minutes to obtain a photosensitive element in which the thickness of the layer of the photosensitive resin composition was about 60 μm.

(c) Formation of a soldering mask

Figure 2:
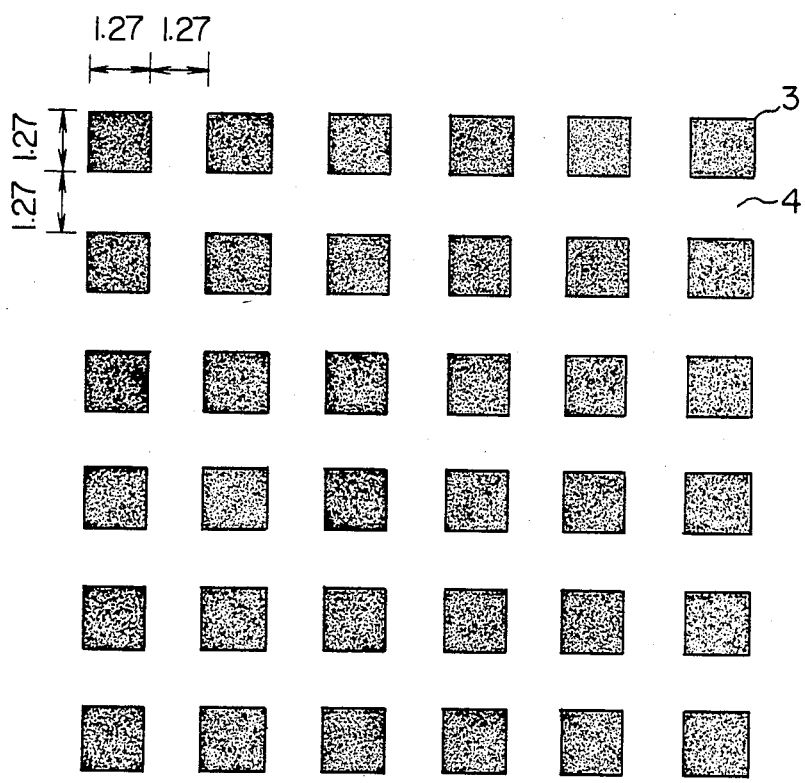
FIG. 2 shows a negative mask for test used in Examples.

Six test substrates having a copper pattern shown in FIG. 1 were obtained by imagewise etching of a laminate faced with glass epoxy copper in which the thickness of its substrate was 1.6 mm and the thickness of the copper foil was 1.8 μm. In FIG. 1, numeral 1 shows a copper pattern part; numeral 2 shows an exposed part of the substrate; and the unit of the figures is mm. The photosensitive element obtained in above (b) was laminated on each of the test substrates by using an A-500 type laminater manufactured by Akebono Industry Co., Ltd. After the lamination, the polyimide film as a support film was peeled off, and the test substrates were exposed at 900 mJ/cm² by means of a Phenix 3000 type exposing machine manufactured by ORC Factory Co., Ltd., by using a negative mask for test shown in FIG. 2. In FIG. 2, numeral 3 shows an opaque part of the negative mask; numeral 4 shows a transparent part of the negative mask; and the unit of the figures is mm. After the exposure, the test substrates were allowed to stand for 30 minutes, and then subjected to spray development at 20° C. for 90 seconds by using 1,1,1-trichloroethane. After the development, they were heated and dried at 80° C. for 10 minutes and then irradiated at 2,5 J/cm² by using an ultraviolet light irradiating equipment manufactured by Toshiba Denzai Co., Ltd.

Thereafter, it was heat-treated at 150° C. for 30 minutes.

Three of the six test substrates on which a protective coating film was thus formed were immersed in isopropanol, toluene or trichlene, all at 25° C., respectively, for 30 minutes to find that the formed protective coating film underwent no change. When another one of the test substrates was immersed in a 10% aqueous sulfuric acid solution for 5 minutes, no change was observed on the formed protective coating film. When another one of the test substrates was immersed in a soldering bath at 255° C. to 265° C. for 30 seconds, its protective coating film was so stable that it did neither crack nor peel off from the substrate, and therefore it was found to be sufficiently usable as a soldering mask.

The remaining one test substitute was subjected to soldering treatment in a soldering bath at 255° to 265° C. for 3 seconds by using a rosin series flux A-226 (manufactured by Tamura Kaken Co., Ltd.), and then subjected to the thermal shock test of 50 cycles under MIL-STD-202E, method 107D, condition B (−65° C. for 30 minutes⇌ordinary temperature for 5 minutes or less⇌125° C. for 30 minutes) to find that its protective coating film did not crack and was greatly excellent in reliability for a long time.

EXAMPLE 2

(a) Synthesis of a urethane diacrylate compound

| A | Trimethylhexamethylene diisocyanate | 1,680 parts (16 equivalents) |
|---|---|---|
|   | Toluene (solvent) | 800 parts |
|   | Di-n-butyl tin diluarate (catalyst) | 1 part |
| B | 2-Hydroxyethyl acrylate | 1,856 parts |

| | -continued | |
|---|---|---|
|   |   | (16 equivalents) |
|   | Methyl ethyl ketone (solvent) | 780 parts |
|   | p-Methoxyphenol (thermopolymerization inhibitor) | 0.3 part |
| C | Ethanol (stopping agent) | 23 parts |

A solution of a urethane acrylate compound was obtained according to the above recipe in the same manner as in Example 1-(a). Thereafter, it was dried under reduced pressure to obtain a viscous urethane diacrylate compound (II).

(b) Production of a photosensitive element

| The urethane diacrylate compound (II) obtained by the above-mentioned process | 40 parts |
|---|---|
| Methyl methacrylate-methyl acrylate-2-hydroxyethyl methacrylate-acrylonitrile (80/10/5/5 weight ratio) copolymer (having a molecular weight of about 100,000 and a glass transition temperature of about 90° C.) | 57 parts |
| Benzophenone | 2.7 parts |
| Michler's ketone | 0.3 part |
| HOSMER CL (a methacrylate containing phosphoric acid groups, manufactured by Yushi Seihin K.K.) | 0.05 part |
| p-Methoxyphenol | 0.1 part |
| Victoria pure blue | 0.05 part |
| Methyl ethyl ketone | 80 parts |
| Toluene | 40 parts |

Figure 3:
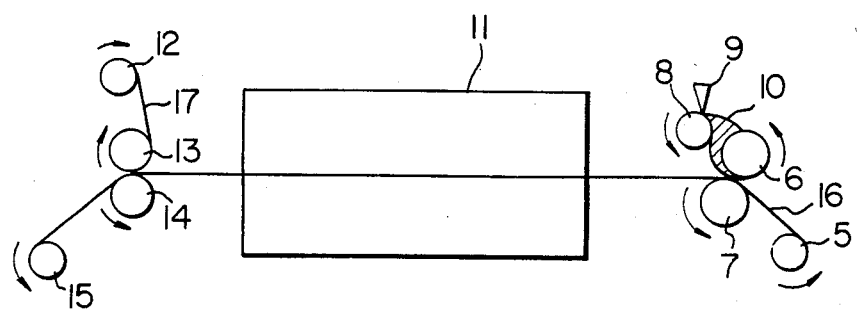
FIG. 3 is a sketch of an apparatus for producing photosensitive elements used in Examples.

A solution 10 of a photosensitive resin composition prepared from the above recipe was uniformly applied to a polyethylene terephthalate film 16 of 25 μm in thickness by using an apparatus shown in FIG. 3, and then dried in a hot-air convection dryer 11 at 80° to 100° C. for about 10 minutes. The thickness after drying of the layer of the photosensitive resin composition was about 100 μm. A polyethylene film 17 of about 25 μm in thickness was stuck as a covering film on the layer of the photosensitive resin composition as shown in FIG. 3.

In FIG. 3, numeral 5 shows a polyethylene terephthalate film delivering roll, numerals 6, 7 and 8 rolls, numeral 9 a knife, numeral 12 a polyethylene film delivering roll, numerals 13 and 14 rolls and numeral 15 a photosensitive element winding roll.

(c) Formation of a soldering mask

The photosensitive element obtained in the above was laminated with heating under pressure on printed wiring boards for test (having a glass epoxy substrate and a thickness of 1.6 mm) in which a copper pattern (copper thickness: about 70 μm) shown in FIG. 1 had been formed, by using a vacuum laminater manufactured by Hitachi Chemical Co., Ltd. (degree of vacuum: 30 mmHg, lamination temperature: 100° C., lamination speed: 2 m/min.). After the lamination, the printed wiring boards were heated at 60° C. for 5 minutes, allowed to stand at room temperature for 3 hours, and then exposed at 150 mJ/cm² through a negative mask for test shown in FIG. 2, as in Example 1-(c).

After the exposure, the boards were heated at 80° C. for 5 minutes and then allowed to stand at room temperature for 20 minutes, after which the support film was peeled off, and the boards were subjected to spray development at 20° C. for 150 seconds by using 1,1,1-trichloroethane.

After the development, the boards were heated and dried at 80° C. for 10 minutes, irradiated with ultraviolet light at 3.0 J/cm$^2$, and then heat-treated at 130° C. for 2 hours.

The test substrates on which a protective coating film had been formed in the manner described above were subjected to an immersion test in isopropanol, toluene, trichlene or a 10% aqueous sulfuric acid solution all at 25° C., respectively, for 30 minutes or 5 minutes in the case of sulfuric acid in the same manner as in Example 1-(c) to find that the formed protective coating film underwent no change.

When the immersion test was carried out in a soldering bath at 255° to 265° C. for 30 seconds, the protective coating film showed no defect and was excellent in heat resistance. Further, in the thermal shock test of 50 cycles under MIL-STD-202E, method 107D, condition B after the same soldering treatment as in Example 1-(c), the formed coating film did not crack.

EXAMPLE 3

| | |
|---|---|
| The urethane diacrylate compound (II) obtained in Example 2-a) | 60 parts |
| Methyl methacrylate-methacrylic acid (98/2 weight ratio) copolymer (having a molecular weight of about 100,000 and a glass transition temperature of about 105° C.) | 37 parts |
| PHOSMER M | 0.1 part |
| Benzophenone | 2.7 parts |
| Michler's ketone | 0.3 part |
| p-Methoxyphenol | 0.1 part |
| Victoria pure blue | 0.02 part |
| Methyl ethyl ketone | 60 parts |
| Toluene | 70 parts |

By the use of a solution of a photosensitive resin composition prepared from the above recipe, a photosensitive element in which the thickness of a layer of the photosensitive resin composition was about 80 μm was obtained by using an apparatus shown in FIG. 3, as in Example 2-(b). The photosensitive element was laminated under reduced pressure in the same manner as in Example 2-(c) on printed wiring boards for test on which a copper pattern (copper thickness: about 50 μm) shown in FIG. 1 had been formed. Further, the same treatment as in Example 2-(c) was carried out to form an imagewise protective coating film on said test substrates. The formed protective coating film showed no defect in the immersion test in isopropanol, toluene, trichlene, or methyl ethyl ketone, for 30 minutes, or in a 10% aqueous sulfuric acid solution or a 10% aqueous NaOH solution for 5 minutes, all at 25° C., respectively, and was so excellent in heat resistance that it did neither crack nor peel off from the substrate in the immersion test for 30 seconds in a soldering bath at 255° to 265° C. Further, when the test substrate was subjected to the same soldering treatment as in Example 1-(c) and then subjected to the thermal shock test of 50 cycles under MIL-STD-202E, method 107D, condition B, the protective coating film did not crack.

COMPARATIVE EXAMPLE 1

The same procedures as in Example 2-(b) and Example 2-(c) were carried out except that trimethylolpropane triacrylate was substituted for the urethane diacrylate compound (II) in Example 2-(b). The finally obtained protective coating film partly peeled off from the substrate in the immersion test in a soldering bath at 255° to 265° C. for 30 seconds. After the same soldering treatment as in Example 1-(c), the protective coating film cracked within 5 cycles in the thermal shock test under MIL-STD-202E, method 107D, condition B.

COMPARATIVE EXAMPLE 2

The same procedures as in Example 2-(b) and Example 2-(c) were carried out except that A-14G (manufacturerd by Shinnakamura Kagaku K.K., polyethylene glycol #600 diacrylate, an average molecular weight about 742, the molecular weight per photosensitive group about 371) was substituted for the urethane diacrylate compound (II) in Example 2-(b). The finally obtained protective coating film did not crack when subjected to the thermal shock test of 50 cycles under MIL-STD-202E, method 107D, conditon B after the soldering treatment in the same manner as in Example 1-(c).

But in the immersion test in trichlene or methyl ethyl ketone at 25° C., the coating film was swelled and partly peeled off within 10 minutes. Further, in the immersion test for 30 seconds in a soldering bath at 255° to 265° C., the coating film was blistered and partly peeled off from the substrate.

COMPARATIVE EXAMPLE 3

The same procedure as in Example 3 was carried out except that 20 parts of pentaerythritol triacylate and 40 parts of a di-(3-acryloxy-2-hydroxypropyl)ester of bisphenol A were substituted for 60 parts of the urethane diacrylate compound (II) in Example 3. After the same soldering treatment as in Example 1-(c), the finally obtained protective coating film cracked within 5 cycles in the thermal shock test under MIL-STD-202E, method 107D, condition B.

EXAMPLE 4

| | |
|---|---|
| The urethane diacrylate compound (II) obtained in Example 2-a) | 60 parts |
| Methyl methacrylate-methacrylic acid-tribromophenyl acrylate (38/2/60 weight ratio) copolymer (having a molecular weight of about 120,000, a glass transistion temperature of about 120° C. and a bromine content of 37% by weight) | 37 parts |
| Benzophenone | 2.7 parts |
| 4,4'-Bis(diethylamino)-benzophenone | 0.3 part |
| KAYAMER-PM 2(a methacrylate containing phosphoric acid groups, manufactured by Nippon Kayaku Co., Ltd.) | 0.1 part |
| 2,2'-Methylenebis(4-ethyl-6-t-butylphenol) | 0.3 part |
| Victoria pure blue | 0.02 part |
| Methyl ethyl ketone | 100 parts |
| Toluene | 50 parts |

The same procedures as in Example 2-(b) and Example 2-(c) were followed, with the exception that a solution of a photosensitive resin composition prepared from the above recipe was used. The finally obtained protective coating film showed no defect in the immersion test for 30 minutes in isopropanol, toluene or trichlene, or for 5 minutes in a 10% aqueous sulfuric acid solution, all at 25° C. and underwent no change such as peeling-off and cracking when immersed in a soldering bath at 255° to 265° C. for 30 seconds. After the same soldering treatment as in Example 1-(c), the protective coating film did not crack in the thermal shock test of 50 cycles under MIL-STD-202E, method 107D, condition B. A protective coating film was formed by the same procedure as in the above on the whole surface of a substrate of 0.8 mm in thickness of a printed wiring substrate MCL-E-68 (flame-retardancy grade of V-0 in UL 94) manufactured by Hitachi Chemical Co., Ltd. This protective coating film satisfied the standards of V-1 in UL94.

EXAMPLE 5

| | |
|---|---|
| The urethane diacrylate compound (II) obtained in Example 2-a) | 40 parts |
| ARONIX M6100 (Oligoester acrylate, manufactured by Toagosei Chemical Industry Co., Ltd.) | 10 parts |
| Methyl methacrylate-methyl acrylate-acrylic acid-tetrahydrofurfuryl methacrylate-tribromophenyl acrylate (40/23/2/10/25 weight ratio) copolymer (having a molecular weight of about 80,000, a glass transistion temperature of about 75° C. and a bromine content of 15% by weight) | 47 parts |
| Benzophenone | 2.7 parts |
| Michler's ketone | 0.3 part |
| KAYAMER-PA 1 (an acrylate containing phosphoric acid groups, manufactured by Nippon Kayaku Co., Ltd.) | 0.02 part |
| 2,2'-Methylenebis(4-methyl-6-t-butylphenol) | 0.5 part |
| Victoria pure blue | 0.02 part |
| Methyl ethyl ketone | 100 parts |
| Toluene | 50 parts |

The same procedures as in Example 2-(b) and Example 2-(c) were followed, with the exception that a solution of a photosensitive resin composition prepared from the above recipe was used. The finally obtained protective coating film showed no defect in the immersion test for 30 minutes in isopropanol, toluene, or trichlene, or for 5 minutes in a 10% aqueous sulfuric acid solution, all at 25° C. and underwent no change such as peeling-off and cracking when immersed in a soldering bath at 255° to 265° C. for 30 seconds. After the same soldering treatment as in Example 1-(c), the protective coating film did not crack in the thermal shock test of 50 cycles under MIL-STD-202E, method 107D, condition B. A protective coating film was formed by the same procedure as in the above on the whole surface of a substrate of 1.6 mm in thickness of a printed wiring board MCL-E-68 manufactured by Hitachi Chemical Co., Ltd. This protective coating film satisfied the standards of V-1 in UL94.

EXAMPLE 6

The same procedure as in Example 5 was followed, with the exception that 1 part of antimony trioxide was additionally incorporated into the solution of the photosensitive resin composition in Example 5. The finally obtained protective coating film was as good as in Example 5 in solvent resistance, heat resistance and resistance to thermal shock. Protective coating film was formed by the same procedure as in the above on the whole surface of a substrate of 1.6 mm in thickness of a printed wiring substrate MCL-E-68 manufactured by Hitachi Chemical Co., Ltd. This protective coating film satisfied the standards of V-0 in UL94.

EXAMPLE 7

(a) Synthesis of a urethane dimethacrylate compound

| | | |
|---|---|---|
| A | Trimethylhexamethylene diisocyanate | 1,680 parts (16 equivalents) |
| | Toluene (solvent) | 1,000 parts |
| | Di-n-butyl tin dilaurate (catalyst) | 1 part |
| B | 2-Hydroxyethyl methacrylate | 2,080 parts (16 equivalents) |
| | Toluene (solvent) | 400 parts |
| | Hydroquinone (thermopolymerization inhibitor) | 0.3 part |
| C | Methanol (stopping agent) | 32 parts |

A solution of a urethane dimethacrylate compound was obtained according to the above recipe in the same manner as in Example 1-(a). Thereafter, it was dried under reduced pressure to obtain a viscous urethane dimethacrylate compound (III).

(b) Production of a photosensitive element and formation of a soldering mask

| | |
|---|---|
| The urethane dimethacrylate compound (III) obtained in the manner described above | 40 parts |
| Methyl methacrylate-methacrylic acid-tetrafurfuryl methacrylate-acrylonitrile-tribromophenyl acrylate (43/2/20/5/30 weight ratio) copolymer (having a molecular weight of about 150,000, a glass transition temperature of about 100° C. and a bromine content of 18% by weight) | 57 parts |
| Benzophenone | 2.7 parts |
| Michler's ketone | 0.3 part |
| PHOSMER M | 0.1 part |
| p-Methoxyphenol | 0.05 part |
| Victoria pure blue | 0.05 part |
| Toluene | 150 parts |

The same procedures as in Example 2-(b) and Example 2-(c) were followed, with the exception that a solution of a photosensitive resin composition prepared from the above receipe was used. The finally obtained protective coating film showed no defect in the immersion test for 30 minutes in isopropanol, tolulene, or trichlene or for 5 minutes in a 10% aqueous sulfuric acid solution, all at 25° C. and underwent no change such as peeling-off and cracking when immersed in a soldering bath at 255° to 265° C. for 30 seconds. After the same soldering treatment as in Example 1-(c), it did not crack in the thermal shock test of 20 cycles under MIL-STD-202E, method 107D, condition B. A protective coating film was formed by the same procedure as above on the whole surface of a substrate of 1.6 mm in thickness of a printed wiring substrate MCL-E-68 manufactured by Hitachi Chemical Co., Ltd. This protective coating film satisfied the standards of V-1 in UL94.

REFERENCE EXAMPLE 1

Synthesis of photopolymerizable unsaturated compound

| | | | |
|---|---|---|---|
| A | Trimethylhexamethylene diisocyanate | 420 | parts |
| | | (4 | equivalents) |
| | Toluene (solvent) | 250 | parts |
| | Di-n-butyl tin dilaurate (catalyst) | 0.2 | part |
| B | 1,4-Butanediol | 90 | parts |
| | | (2 | equivalents) |
| C | 2-Hydroxyethyl acrylate | 232 | parts |
| | | (2 | equivalents) |
| | Toleuene (solvent) | 70 | parts |
| | Hydroquinone (thermopolymerization inhibitor) | 0.1 | part |
| D | Methanol (stopping agent) | 8 | parts |

The ingredient A was placed in a reactor having a capacity of about 1 liter equipped with thermometer, a stirrer, a condenser, a nitrogen-gas-introducing tube and a dropping funnel, which reactor could be heated and cooled, and then heated to 60° C. with stirring. The ingredient B was uniformly added dropwise to A in the reactor over a period of about 3 hours while maintaining the reaction temperature at 55° to 65° C. After the addition of B, the resulting mixture was maintained at a temperature of 55° to 65° C. for about 2 hours, after which the ingredient C was uniformly added thereto dropwise at a temperature of about 55° to 65° C. over a period of about 3 hours. After the addition of C, the reaction temperature was gradually raised to 80° C. over a period of about 5 hours.

Thereafter, the temperature was lowered to 60° C., after which the ingredient D was added to the reaction mixture, and the thus obtained mixture was continuously stirred for about 1 hour. Thus a solution of a photopolymerizable unsaturated compound was obtained. Subsequently, the solution was dried under reduced pressure to give a viscous photopolymerizable unsaturated compound (V).

EXAMPLE 8

| | |
|---|---|
| The urethane diacrylate compound (II) obtained in Example 2-a) | 45 parts |
| Photopolymerizable unsaturated compound (V) obtained in Reference Example 1 | 8 parts |
| Methyl methacrylate-ethyl acrylate-methacrylic acid-tribromophenyl acrylate (69/10/1/20 weight ratio) copolymer (having a molecular weight of about 180,000, a glass transition temperature of about 95° C., and a bromine content of 12%) | 44 parts |
| Benzophenone | 2.7 parts |
| Michler's ketone | 0.3 part |
| PHOSMER M | 0.1 part |

| -continued | |
|---|---|
| 2,2'-Methylenebis(4-methyl-6-t-butylphenol) | 0.2 part |
| Victoria pure blue | 0.01 part |
| Methyl ethyl ketone | 100 parts |
| Toluene | 50 parts |

The same procedures as in Example 2-(b) and Example 2-(c) were followed, with the exception that a solution of a photosensitive resin composition prepared from the above recipe was used. The finally obtained protective coating film showed no defect in the immersion test for 20 minutes in isopropanol, tolulene, or trichlene or for 5 minutes in a 10% aqueous sulfuric acid solution, all at 25° C., and underwent no change such as peeling-off and cracking when immersed in a soldering bath at 255° to 265° C. for 30 seconds. It did not crack also in the thermal shock test of 50 cycles under MIL-STD-202E, method 107D, condition B after the same soldering treatment as in Example 1-(c).

COMPARATIVE EXAMPLE 4

A urethane diacrylate compound was synthesized in the same manner as in Example 2-(a), except that 1,344 parts (16 equivalents) of hexamethylene diisocyanate was substituted for 1,680 parts (16 equivalents) of trimethylhexamethylene diisocyanate in Example 2-(a).

The produced urethane diacrylate compound (VI) was insoluble in toluene, the reaction solvent, and separated as wax just as it was produced. The obtained urethane diacrylate compound (VI) was slightly soluble in methyl ethyl ketone and 1,1,1-trichloroethane, and soluble in acetone and chloroform.

| | |
|---|---|
| The obtained urethane diacrylate compound (VI) | 50 parts |
| The copolymer used in Example 2-b) | 47 parts |
| Benzophenone | 2.7 parts |
| Michler's ketone | 0.3 part |
| PHOSMER CL | 0.05 part |
| p-Methoxyphenol | 0.05 part |
| Victoria pure blue | 0.02 part |
| Acetone | 50 parts |
| Chloroform | 100 parts |

A solution of a photosensitive resin composition prepared from the above recipe was applied to a polyethylene terephthalate film by using an apparatus shown in FIG. 3, as in Example 2-(b), and then dried in hot air to find that the urethane diacrylate compound (VI) and the copolymer separated from each other just as the solvent was dried, so that no desirable photosensitive element could be obtained. When any of the copolymers used in Examples 1 to 8 was used, the miscibility was as low as in the above, and no desirable photosensitive element could be obtained.

COMPARATIVE EXAMPLE 5

A solution of a urethane diacrylate compound was synthesized in the same manner as in Example 2-(a), except that 1,392 parts (16 equivalents) of tolylene diisocyanate (manufactured by Nippon Polyurethane Co., Ltd.) was substituted for 1,680 parts (16 equivalents) of trimethylhexamethylene diisocyanate of Example 2-(a). Subsequently, the solution was dried under reduced pressure to give a viscous urethane diacrylate compound (VII). The urethane diacrylate compound (VII)

was crystallized gradually at room temperature and almost completely crystallized after one month standing. The crystallized urethane diacrylate compound (VII) was insoluble in toluene and hardly soluble in 1,1,1-trichloroethane.

| | |
|---|---|
| The urethane diacrylate compound (VII) obtained in the above | 50 parts |
| The copolymer used in Example 2-b) | 47 parts |
| Benzophenone | 2.7 parts |
| Michler's ketone | 0.3 part |
| PHOSMER M | 0.1 part |
| p-Methoxyphenol | 0.05 part |
| Victoria pure blue | 0.02 part |
| Acetone | 50 parts |
| Chloroform | 100 parts |

A solution of a photosensitive resin composition prepared from the above recipe was applied to a polyethylene terephthalate film by using, as in Example 2-(b), an apparatus shown in FIG. 3, to give a photosensitive element having the layer of the photosensitive resin composition in about 80 μm thick. Using the resulting photosensitive element immediately, imagewise protecting films were formed on test substrates as in Example 3. The finally obtained protective coating film showed no defect in the immersion test for 30 minutes in toluene, trichlene or methyl ethyl ketone at 25° C., and underwent no change such as peeling-off and cracking when immersed in a soldering bath at 255° C. to 265° C. for 30 seconds. But it showed cracks in the thermal shock test within 10 cycles under MIL-STD-202E, method 107D, condition B after the same soldering treatment as in Example 1-(c).

Further, when the obtained photosensitive element was allowed to stand at room temperature, the urethane diacrylate compound (VII) in the photosensitive resin composition was gradually phase separated and, crystallized and finally the layer of the photosensitive resin composition in the photosensitive element was whitened in about one week.

EXAMPLE 9

The same solution of photosensitive resin composition as used in Example 1-(b) was coated uniformly on a polyethylene terephthalate film having a thickness of 25 μm using the apparatus shown in FIG. 3, followed by drying with heating at 100° C. to give a photosensitive element in which the thickness of the layer of the photosensitive resin composition after dried was about 70 μm. The resulting photosensitive element was laminated on the copper surface of copper-clad glass-epoxy laminate, the thickness of substrate being 1.6 mm and the thickness of copper foil being 18 μm by using an A-500 type laminater manufactured by Akebono Industry Co., Ltd. Then, the whole layer of photosensitive resin composition on the copper-clad laminate was cured by using a Phenix 3000 type exposing machine manufactured by ORC Factory Co., Ltd., with irradiation of ultraviolet rays at 150 mJ/cm². The polyethylene terephthalate film was peeled off and the remaining laminate was dipped in 1,1,1-trichloroethane at 20° C. for 120 seconds, followed by drying at 80° C. for 10 minutes with heating. Then, the resulting laminate was irradiated with ultraviolet rays at 3 J/cm² using a high pressure mercury lamp H5600L/81-N manufactured by Toshiba Denzai Co., Ltd., followed by heating at 150° C. for 30 minutes. Thus, there was obtained a test substrate wherein a cured film of the photosensitive resin composition was formed on the copper-clad laminate.

Using the test substrate, adhesiveness of the cured film to the copper surface was evaluated by contacting the test substrate with a solder bath at 260° C. for 10 seconds, followed by the conventionally used cross-cut test wherein the cured film was cut with a blade at intervals of 2 mm crosswise. There was admitted no lifting nor peeling and thus the adhesiveness was excellent.

COMPARATIVE EXAMPLE 6

A photosensitive element was obtained in the same manner as described in Example 9 except that PHOSMER M was not used in the solution of photosensitive resin composition of Example 1-(b). The resulting photosensitive element was laminated on the surface of copper-clad glass-epoxy laminate to form a test substrate with a cured film in the same manner as described in Example 9. After contacting the test substrate with a solder bath at 260° C. for 10 seconds, the cross-cut test was conducted. A part of the cured film was lifted on the copper surface and peeled off by the cross-cut test (67/100).

COMPARATIVE EXAMPLE 7

A photosensitive element was obtained in the same manner as described in Example 9, except that 0.2 part of trisacryloxyethyl phosphate was used in place of PHOSMER M in the solution of photosensitive resin composition of Example 1-(b). The resulting photosensitive element was laminated on the surface of copper-clad glass-epoxy laminate to form a test substrate with a cured film in the same manner as described in Example 9. After contacting the test substrate with a solder bath at 260° C. for 10 seconds, the cross-cut test was conducted. A part of the cured film was lifted on the copper surface and peeled off by the cross-cut test (72/100).

As explained in detail in Examples, the photosensitive resin composition and the photosensitive element of this invention give a protective coating film excellent in heat resistance, resistance to thermal shock and solvent resistance, and the given protective coating film is suitable as a soldering mask which is required to have long-term reliability.

The above is nothing but an example of the photosensitive resin composition and the photosensitive element of this invention, and needless to say, various changes and modifications may be made therein without departing from the spirit of scope of this invention.

What is claimed is:
1. A photosensitive resin composition for forming a solder mask comprising
   (a) 20 to 75 parts by weight of an urethane diacrylate or urethane dimethacrylate compound that has a molecular weight of 600 or less and that is obtained by reacting,
      (i) trimethylhexamethylene diisocyanate and
      (ii) an acrylic or methacrylic monoester of a dihydric alcohol which has 1 to 8 carbon atoms,
   (b) 20 to 75 parts by weight of a linear polymeric compound having a glass transition temperature of about 40° to 150° C.,
   (c) a sensitizer and/or a sensitizer system which generate free radicals owing to actinic light in an amount of 0.5 to 10% by weight based on the total weight of the urethane diacrylate or urethane di- methacrylate compound (a) and the linear polymeric compound (b), and (d) an acrylic or methacrylic ester containing a phosphoric acid group in the molecule represented by the formula:

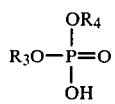

wherein $R_3$ is an organic group containing an acryloyl or methacryloyl group; and $R_4$ is hydrogen or an organic group containing an alkyl group or an acryloyl or methacryloyl group, in an amount of 0.01 to 5% by weight based on the total weight of the urethane diacrylate or urethane dimethacrylate compound (a) and the linear polymeric compound (b).

2. A composition according to claim 1, wherein the urethane diacrylate or dimethacrylate compound (a) is represented by the following formula:

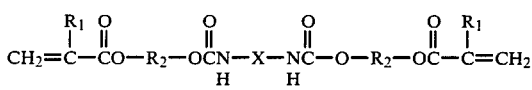

wherein $R_1$ is H or $CH_3$; $R_2$ is a residue of a dihydric alcohol; and X is a trimethylhexamethylene group.

3. A composition according to claim 1, wherein the acrylic or methacrylic monoester of a dihydric alcohol (ii) is hydroxyethyl acrylate, hydroxyethyl methacrylate, hydroxypropyl acrylate or hydroxypropyl methacrylate.

4. A composition according to claim 1, wherein the linear polymeric compound (b) is a vinyl series copolymer.

5. A composition according to claim 1, wherein the linear polymeric compound (b) contains bromine atoms in an amount up to 40% by weight.

6. A composition according to claim 4, wherein the linear polymeric compound (b) contains 5 to 65% by weight of tribromophenyl acrylate or tribromophenyl methacrylate as a copolymer component.

7. A composition according to claim 1, which additionally contains antimony trioxide in an amount up to 5% by weight.

8. A photosensitive element for forming a solder mask comprising (I) a layer of a photosensitive resin composition comprising (a) 20 to 75 parts by weight of a urethane diacrylate or urethane dimethacrylate compound that has a molecular weight of 600 or less and that is obtained by reacting, (i) trimethylhexamethylene diisocyanate, and (ii) an acrylic or methacrylic monoester of a dihydric alcohol which has 1 to 8 carbon atoms, (b) 20 to 75 parts by weight of a linear polymeric compound having a glass transition temperature of about 40° to 150° C., (c) a sensitizer and/or a sensitizer system which generate free radicals owing to actinic light in an amount of 0.5 to 10% by weight based on the total weight of the urethane diacrylate or urethane dimethacrylate compound (a) and the linear polymeric compound (b), and (d) an acrylic or methacrylic ester containing a phosphoric acid group in the molecule represented by the formula:

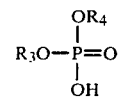

wherein $R_3$ is an organic group containing an acryloyl or methacryloyl group; and $R_4$ is hydrogen or an organic group containing an alkyl group or an acryloyl or methacryloyl group, in an amount of 0.01 to 5% by weight based on the total weight of the urethane diacrylate or urethane dimethacrylate compound (a) and the linear polymeric compound (b), and (II) a support film supporting said layer.

9. A photosensitive element according to claim 8, wherein the urethane diacrylate or dimethacrylate compound (a) in the layer (I) of the photosensitive resin composition is represented by the following formula:

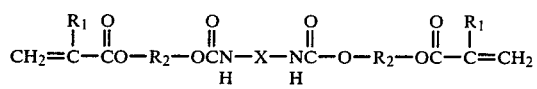

wherein $R_1$ is H or $CH_3$; $R_2$ is a residue of a dihydric alcohol; and X is a trimethylhexamethylene group.

10. A photosensitive element according to claim 8, wherein the acrylic or methacrylic monoester of dihydric alcohol (ii) in the layer (I) of the photosensitive resin composition is hydroxyethyl acrylate, hydroxyethyl methacrylate, hydroxypropyl acrylate or hydroxypropyl methacrylate.

11. A photosensitive element according to claim 8, wherein the linear polymeric compound (b) in the layer (I) of the photosensitive resin composition is a vinyl series copolymer.

12. A photosensitive element according to claim 8, wherein the linear polymeric compound (b) in the layer (I) of the photosensitive resin composition contains bromine atoms in an amount up to 40% by weight.

13. A photosensitive element according to claim 11, wherein the linear polymeric compound (b) in the layer (I) of the photosensitive resin composition contains 5 to 65% by weight of tribromophenyl acrylate or tribromophenyl methacrylate as a polymerization component.

14. A photosensitive element according to claim 8, wherein the layer (I) of the photosensitive resin composition additionally contains antimony trioxide in an amount up to 5% by weight.

15. A photosensitive element according to claim 8, wherein the layer (I) of the photosensitive resin composition has a thickness of 20 to 200 μm.

16. A photosensitive element according to claim 8, wherein the support film (II) is a polyester film, a polyimide film, a polyamide-imide film, a polypropylene film or a polystyrene film.

17. A photosensitive element according to claim 8, which further laminates a releasable covering film on the layer (I) of the photosensitive resin composition.

18. A process for forming a solder mask by employing a photosensitive resin composition in the construction of said solder mask wherein the photosensitive resin conposition is applied to a support film as a photosensitive layer, said photosensitive resin composition comprising (a) 20 to 75 parts by weight of an urethane diacrylate or urethane dimethacrylate compound that has a molecular weight of 600 or less and that is obtained by reacting,
(i) trimethylhexamethylene diisocyanate and
(ii) an acrylic or methacrylic monoester of a dihydric alcohol which has 1 to 8 carbon atoms,
(b) 20 to 75 parts by weight of a linear polymeric compound having a glass transition temperature of about 40° to 150° C.,
(c) a sensitizer and/or a sensitizer system which generate free radicals owing to actinic light in an amount of 0.5 to 10% by weight based on the total weight of the urethane diacrylate or urethane dimethacrylate compound (a) and the linear polymeric compound (b), and (d) an acrylic or methacrylic ester containing a phosphoric acid group in the molecule represented by the formula:

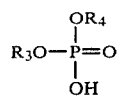

wherein $R_3$ is an organic group containing an acryloyl or methacryloyl group; and $R_4$ is hydrogen or an organic group containing an alkyl group or an acryloyl or methacryloyl group, in an amount of 0.01 to 5% by weight based on the total weight of the urethane diacrylate or urethane dimethacrylate compound (a) and the linear polymeric compound (b).

* * * * *